United States Patent
Liao

(10) Patent No.: US 8,531,017 B2
(45) Date of Patent: Sep. 10, 2013

(54) SEMICONDUCTOR PACKAGES HAVING INCREASED INPUT/OUTPUT CAPACITY AND RELATED METHODS

(75) Inventor: Guo-Cheng Liao, Kaohsiung (TW)

(73) Assignee: Advanced Semiconductor Engineering, Inc., Kaohsiung (TW)

(\*) Notice: Subject to any disclaimer, the term of this patent is extended or adjusted under 35 U.S.C. 154(b) by 211 days.

(21) Appl. No.: 13/026,991

(22) Filed: Feb. 14, 2011

(65) Prior Publication Data

US 2012/0061808 A1 Mar. 15, 2012

(30) Foreign Application Priority Data

Sep. 14, 2010 (TW) ................. 99131048 A

(51) Int. Cl.
*H01L 23/495* (2006.01)

(52) U.S. Cl.
USPC ........................................... 257/676

(58) Field of Classification Search
USPC ........................................... 257/676
See application file for complete search history.

(56) References Cited

U.S. PATENT DOCUMENTS

| | | | |
|---|---|---|---|
| 6,001,671 A | 12/1999 | Fjelstad | |
| 6,238,952 B1 | 5/2001 | Lin | |
| 6,242,284 B1 | 6/2001 | Kang et al. | |
| 6,261,864 B1 | 7/2001 | Jung et al. | |
| 6,291,271 B1 | 9/2001 | Lee et al. | |
| 6,306,685 B1 | 10/2001 | Liu et al. | |
| 6,333,252 B1 | 12/2001 | Jung et al. | |
| 6,342,730 B1 | 1/2002 | Jung et al. | |
| 6,400,004 B1 | 6/2002 | Fan et al. | |
| 6,451,627 B1 | 9/2002 | Coffman | |
| 6,495,909 B2 | 12/2002 | Jung et al. | |
| 6,498,099 B1 | 12/2002 | McLellan et al. | |
| 6,528,893 B2 | 3/2003 | Jung et al. | |
| 6,534,330 B2 | 3/2003 | Sakamoto et al. | |
| 6,586,677 B2 | 7/2003 | Glenn | |
| 6,658,734 B2 | 12/2003 | Yamada et al. | |
| 6,664,615 B1 | 12/2003 | Bayan et al. | |
| 6,700,188 B2 | 3/2004 | Lin | |
| 6,812,552 B2 | 11/2004 | Islam et al. | |
| 6,861,295 B2 | 3/2005 | Jung et al. | |
| 6,927,096 B2 | 8/2005 | Shimanuki | |
| 6,993,594 B2 | 1/2006 | Schneider | |
| 7,049,177 B1 \* | 5/2006 | Fan et al. ............... | 438/123 |
| 7,183,630 B1 | 2/2007 | Fogelson et al. | |

(Continued)

FOREIGN PATENT DOCUMENTS

| | | |
|---|---|---|
| CN | 101442035 | 5/2009 |
| CN | 101540309 | 9/2009 |

(Continued)

OTHER PUBLICATIONS

Lai et al.; "Development and performance charaterizations of a QFN/HMT package"; Electronic Components and Technology Conference; pp. 964-967 (2008).

*Primary Examiner* — Jenny L Wagner

(74) *Attorney, Agent, or Firm* — Klein, O'Neill & Singh, LLP

(57) ABSTRACT

A semiconductor package includes leads around the periphery of a chip and leads under the chip having connecting segments for increasing I/O capability. A filling material may be used under the chip, which may provide a lead locking function. Various methods of forming the semiconductor package are further provided.

20 Claims, 21 Drawing Sheets

(56) References Cited

U.S. PATENT DOCUMENTS

| | | |
|---|---|---|
| 7,247,526 B1 | 7/2007 | Fan et al. |
| 7,271,032 B1 | 9/2007 | McLellan et al. |
| 8,125,062 B2 * | 2/2012 | Shoji et al. .................... 257/666 |
| 2005/0247944 A1 | 11/2005 | Haque et al. |
| 2007/0018291 A1 | 1/2007 | Huang et al. |
| 2007/0052076 A1 | 3/2007 | Ramos et al. |
| 2007/0059863 A1 | 3/2007 | Li et al. |
| 2007/0085199 A1 | 4/2007 | Ong et al. |
| 2007/0181983 A1 | 8/2007 | Takai et al. |
| 2008/0067649 A1 | 3/2008 | Matsunaga et al. |
| 2008/0258278 A1 | 10/2008 | Ramos et al. |
| 2010/0044843 A1 | 2/2010 | Chang Chien et al. |

FOREIGN PATENT DOCUMENTS

| | | |
|---|---|---|
| CN | 102044510 | 5/2011 |
| JP | 5166985 | 7/1993 |
| JP | 11195733 | 7/1999 |
| JP | 2001024135 | 1/2001 |

* cited by examiner

SEMICONDUCTOR PACKAGES HAVING INCREASED INPUT/OUTPUT CAPACITY AND RELATED METHODS

CROSS-REFERENCE TO RELATED APPLICATION

This application claims priority to Taiwan Patent Application No. 99131048, filed on Sep. 14, 2010, the subject matter of which is incorporated by reference herein in its entirety.

TECHNICAL FIELD

The present disclosure relates to semiconductors and more particularly to semiconductor assembly and packaging.

BACKGROUND

Flat No leads packages, such as Quad Flat No leads (QFN), operationally couple integrated circuits to printed circuit boards. The QFN package structure typically includes a semiconductor chip, a die pad upon which the chip is located, an array of leads, and a package body. A plurality of bonding wires electrically connects the chip to upper surfaces of the leads. Exposed lower surfaces of the leads are used as the external contacts of the QFN package structure. The leads are generally arranged in a perimeter array circumscribing the chip. An area beneath the chip may include leads, but they are typically not used for input/output (I/O). It is desirable to increase the I/O capacity of QFNs.

SUMMARY

One embodiment of the present semiconductor packages comprises a semiconductor chip, a plurality of first leads, and a plurality of second leads. Each of the second leads is disposed at least partially under the chip, and has an upper sloped portion and a lower sloped portion meeting at a peak. The semiconductor package further comprises a plurality of bonding pads extending outside a periphery of the chip, and a plurality of connecting segments connecting each bonding pad to a respective one of the second leads. A filling material occupies spaces between the chip and the upper sloped portions of the second leads.

Another embodiment of the present semiconductor packages comprises a semiconductor chip, a plurality of first leads, and a plurality of second leads. Each of the second leads is disposed at least partially under the chip. The semiconductor package further comprises a plurality of bonding pads extending outside a periphery of the chip, and a plurality of connecting segments connecting each bonding pad to a respective one of the second leads. Upper surfaces of the first leads, the second leads, the bonding pads and the connecting segments are coplanar.

One embodiment of the present semiconductor packaging processes comprises forming a patterned first metal plating layer on a top surface of a conductive substrate. The first metal plating layer comprises a plurality of first lead metal patterns located outside of a chip bonding region of the substrate, a plurality of bonding pad metal patterns located outside of the chip bonding region, a plurality of second lead metal patterns located within the chip bonding region, and a plurality of connecting segment metal patterns extending between the second lead metal patterns and the bonding pad metal patterns. The semiconductor packaging process further comprises forming a patterned second metal plating layer on an undersurface of the conductive substrate. The process further comprises performing a half etching process on the top surface of the conductive substrate to form recessed areas in the top surface, including recessed areas in the chip bonding region, the recessed areas including upper sloped portions. The process further comprises inserting a filling material into the recessed areas in the chip bonding region, such that the filling material occupies spaces between the upper sloped portions of the recessed areas. The process further comprises bonding a semiconductor chip in the chip bonding region of the conductive substrate, wherein the chip is located above the filling material and the second lead metal patterns. The process further comprises wire bonding the semiconductor chip to the bonding pad metal patterns and to the first lead metal patterns through a plurality of bonding wires. The process further comprises etching the undersurface of the conductive substrate to form a plurality of first leads located outside of the chip bonding region, a plurality of bonding pads located outside of the chip bonding region, a plurality of second leads located within the chip bonding region, and a plurality of connecting segments extending between the second leads and the bonding pads.

BRIEF DESCRIPTION OF THE DRAWINGS

Common reference numerals are used throughout the drawings and the detailed description to indicate the same elements. The present invention will be more apparent from the following detailed description taken in conjunction with the accompanying drawings.

DETAILED DESCRIPTION

Figure 1A:
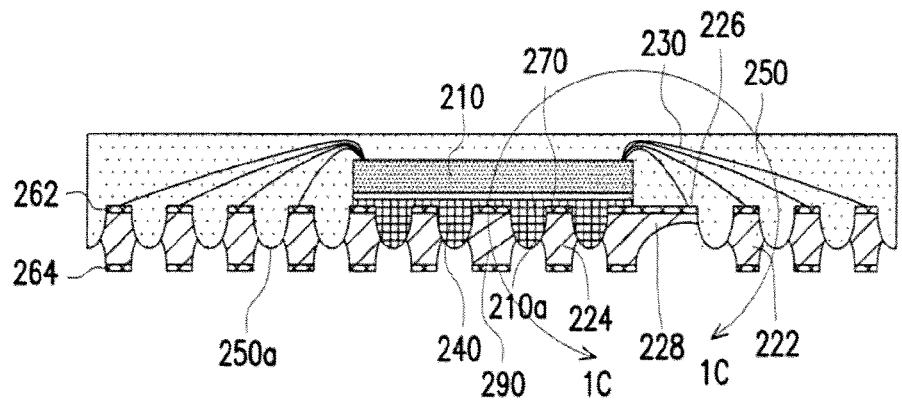
FIG. 1A is a cross-sectional view of a semiconductor package structure according to one of the present embodiments.
Figure 1B:
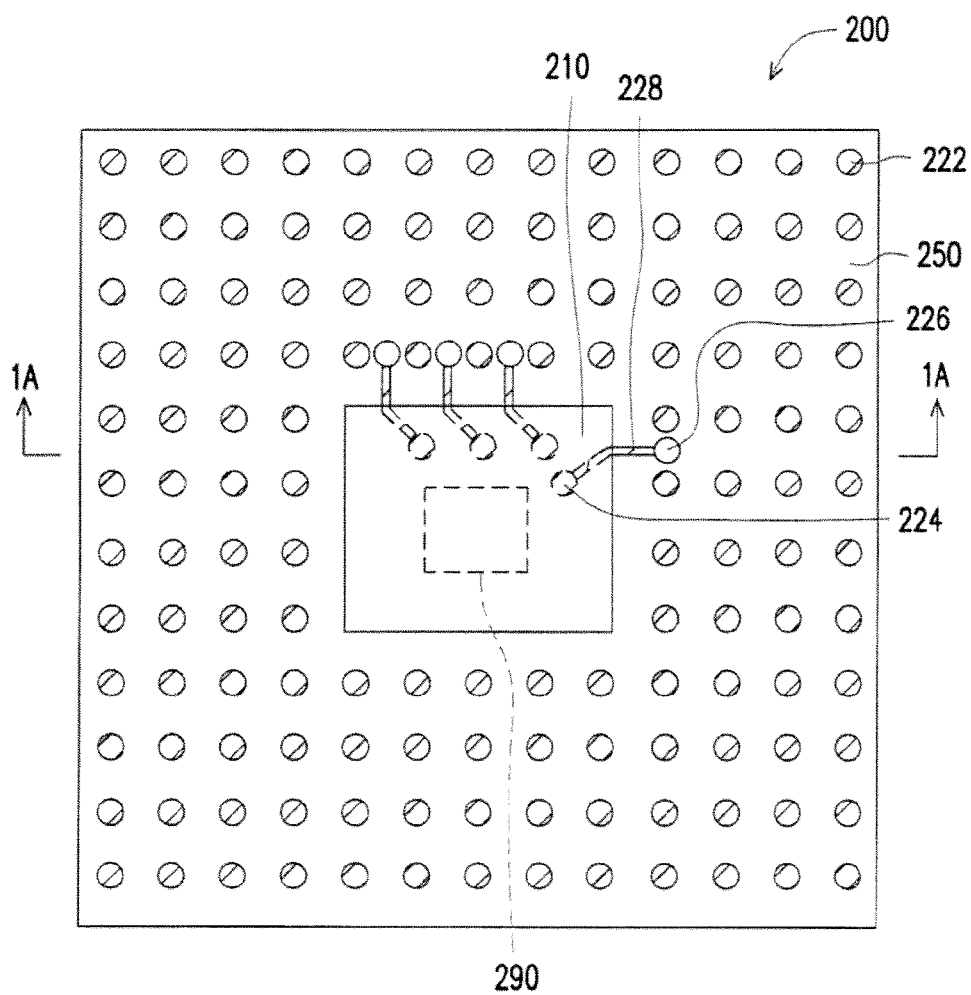
FIG. 1B is a top plan view of the semiconductor package structure of FIG. 1A.
Figure 1C:
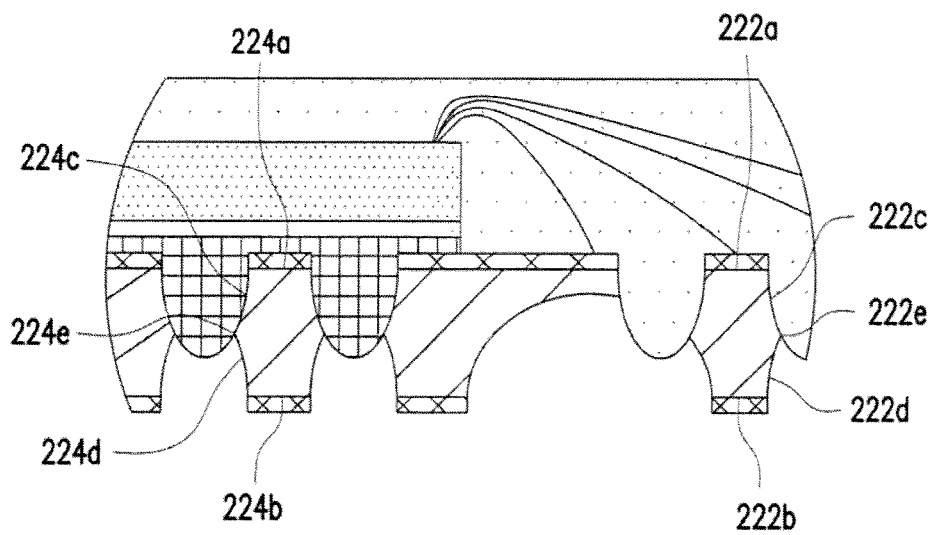
FIG. 1C is a detail view of the portion of FIG. 1A indicated by the circle 1C-1C.

Referring to FIGS. 1A-1C one embodiment of the present a semiconductor package structures 200 is illustrated. The package 200 comprises a chip or die 210, a plurality of first leads 222 and second leads 224, a plurality of bonding pads 226, a plurality of connecting segments 228, a plurality of bonding wires 230, a filling material 240 and a molding compound 250 also referred to as a package body or an encapsulant. For clarity, FIG. 1B omits the bonding wires 230 and the molding compound 250 shown in FIG. 1A, and illustrates one example of routing for the connecting segments 228, as discussed further below.

With reference to FIG. 1B, the second leads 224 are located under or partially under the chip 210. The connecting segments 228 connect the bonding pads 226, which are disposed outside a perimeter of the chip 210, to the second leads 224. In FIG. 1B, the connecting segments 228 are shown with an angular offset routing. However, the routing may be a straight linear path as well as other angled paths between the bonding pads 226 and the second leads 224. In certain embodiments, the routing may be a combination of straight linear path as well as angled paths.

With reference to FIG. 1C, each of the first leads 222 comprises an upper surface 222a, a lower surface 222b, an upper sloped portion 222c adjacent to the upper surface 222a and a lower sloped portion 222d adjacent to the lower surface 222b. Each of the second leads 224 comprises an upper surface 224a, a lower surface 224b, an upper sloped portion 224c adjacent to the upper surface 224a and a lower sloped portion 224d adjacent to the lower surface 224b. The sloped portions of the leads 222 and 224 may be slightly concave due to the manufacturing etch process. The upper surfaces 222a and 224a are substantially coplanar and the lower surfaces 222b and 224b are also substantially coplanar. For the first leads 222, a peak 222e may be formed where each upper sloped portion 222c meets its respective lower sloped portion 222d. Likewise, for the second leads 224, a peak 224e may be formed where each upper sloped portion 224c meets its respective lower sloped portion 224d. The peaks 222e, 224e may fully circumscribe their respective leads 222, 224. However, the peaks 224e on the second leads 224 may not fully circumscribe the second leads 224 due to the connecting segments 228.

With reference to FIG. 1A, the bonding wires 230 electrically connect the chip 210 to the first leads 222 and the bonding pads 226. As discussed above, the second leads 224 are located under the chip 210, the bonding pads 226 are configured outside a periphery of the chip 210, and the connecting segments 228 connect the bonding pads 226 and the second leads 224. The bonding wires 230 thus electrically connect the chip 210 to the second leads 224 under the chip 210 through the bonding pads 226 and the connecting segments 228 so that the second leads 224 can be used for input/output (I/O).

With reference to FIGS. 1A and 1C, the molding compound 250 substantially covers the upper sloped portions 222c of the first leads 222 and the upper sloped portions 224c of some of the second leads 224. The lower sloped portions 222d of the first leads 222 and at least some of the lower sloped portions 224d of the second leads 224 protrude from the undersurface 250a of the molding compound 250. The filling material 240 is interposed between the chip 210 and the second leads 224, particularly the upper sloped surfaces 224c of the second leads 224. In the illustrated embodiment, the molding compound 250 is formed about the chip 210, the bonding pads 226, the connecting segments 228, the bonding wires 230, the leads first leads 222 and a portion of the second leads 224. In certain embodiments, the molding compound 250 may extend around the peaks 222e, 224e of some or all of the leads 222, 224. In such embodiments, the molding compound 250 provides a mechanical hold on the leads 222, 224, making it less likely that the leads 222, 224 will release from the molding compound 250. However, in other embodiments the undersurface 250a of the molding compound 250 may be substantially coplanar with the peaks 222e, 224e.

The compositions of the filling material 240 and the molding compound 250 may be the same or different from one another. Thus, in a process of making the package 200, the filling material 240 may be formed in the package 200 in one step, and then the molding compound 250 is formed in a later step. Alternatively, the step of forming the filling material 240 can be omitted and the molding compound 250 can fill the spaces between the chip 210 and the second leads 224 when the molding compound 250 is formed. One advantage of forming the filling material 240 in advance of the molding compound 250 is to form a flat region for placing the chip 210 so that the stability of the chip 210 is enhanced. In alternative embodiments, the thickness of the filling material 240 can be changed according to prevailing requirements so that the elevation of the exposed surface of the filling material 240 is higher than, equal to, or lower than the upper surfaces 224a of the second leads 224.

With reference to FIG. 1C, the illustrated embodiment includes an adhesion layer 270 disposed between the undersurface 210a of the chip 210 and the filling material 240. Advantageously, the filling material 240 may prevent the optional adhesion layer 270 on the undersurface of the chip 210 from being exposed in later process steps. The filling material 240 may be, for example, and without limitation, a polymer material, a solder mask, a dry film material, or an epoxy resin made from a dispensing process. When epoxy resin is used as the filling material 240, the filling material 240 can perform the dual functions of adhering and fixing the chip 210, allowing the adhesion layer 270 to be omitted.

With reference to FIG. 1A, in some embodiments a first metal plating layer 262 may be provided on the upper surface 222a of each of the first leads 222, the upper surface 224a of each of the second leads 224, the bonding pads 226 and the connecting segments 228. The upper surfaces 222a of the first leads 222 and the first metal plating layer 262 thereon are enclosed within the molding compound 250. The upper surfaces 224a of the second leads 224 and the first metal plating layer 262 thereon are enclosed within the filling material 240 and/or the molding compound 250. The first metal plating layer 262 may serve as an etching mask while the upper portions of the first leads 222 and the second leads 224 are formed. The first metal plating layer 262 may also enhance the bond between the bonding wires 230 and the first leads 222, and between the bonding wires 230 and the bonding pads 226. More specifically, the first leads 222 and/or the second leads 224 may be, for example, copper. The first metal plating layer 262 may be, for example, gold, sliver, a nickel/gold stacked layer or a nickel/palladium/gold stacked layer. The bonding wires 230 can be effectively bonded to the surface of the first metal plating layer 262. Similarly, a second metal plating layer 264 may be disposed on the lower surfaces 222b of the first leads 222 and the lower surfaces 224b of the second leads 224. The composition of the second metal plating layer 264 may be similar to or different from the composition of the first metal plating layer 262. In the illustrated embodiment, the bonding pads 226 and the connecting segments 228 are not covered by the second metal plating layer 264.

As illustrated in FIG. 1A, a die pad 290 may be optionally formed under the chip 210. The a die pad 290 is electrically isolated from the first leads 222 and the second leads 24. In this embodiment, the second leads 224 occupy only a portion of the area under the chip 210, while the die pad 290 occupies the remaining space under the chip 210 and supports the chip 210. The die pad 290 may also serve as a heat sink to enhance heat dissipation from the chip 210.

Figure 2A:
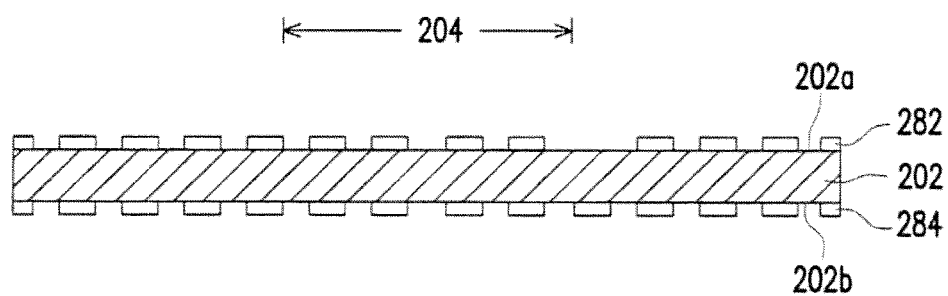
FIGS. 2A-2J are cross-sectional views of various steps in a semiconductor packaging process according to one of the present embodiments.
Figure 2B:
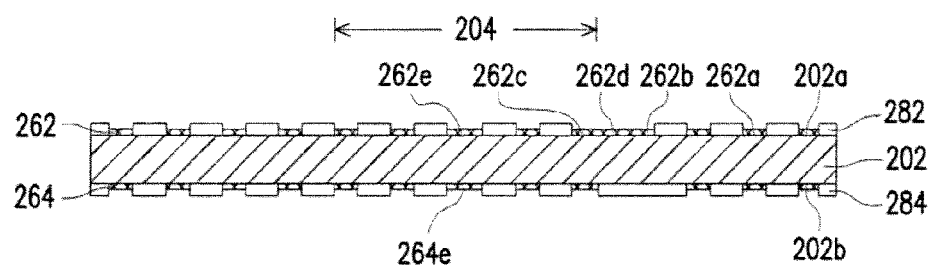
Figure 2C:
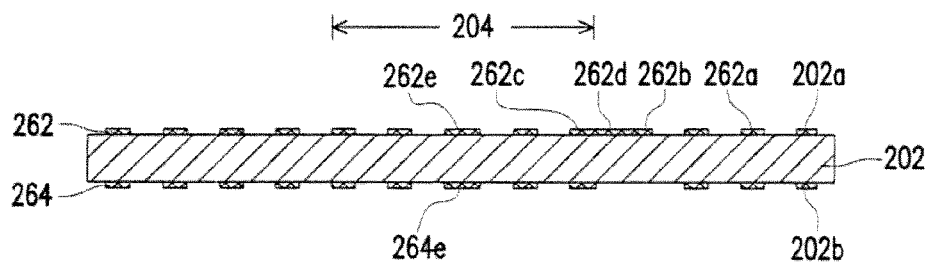

FIGS. 2A-2J are cross-sectional views illustrating a semiconductor packaging process according to one of the present embodiments. Referring to FIGS. 2A-2C, a first metal plating layer 262 and a second metal plating layer 264 are formed on a top surface 202a and on an undersurface 202b, respectively, of a conductive substrate 202. With reference to FIG. 2A, the method for forming the first metal plating layer 262 and the second metal plating layer 264 may comprise forming a first patterned mask 282 on the top surface 202a of the conductive substrate 202. The top surface 202a of the conductive substrate 202 has a chip bonding region 204. In the present embodiment, the first patterned mask 282 can be, for example, a dry film photoresist or a wet photoresist.

As shown in FIG. 2B, in one embodiment an electroplating process forms the first metal plating layer 262 on a portion of the top surface 202a exposed by the first patterned mask 282. The first metal plating layer 262 comprises a plurality of first lead metal patterns 262a located outside the chip bonding region 204, a plurality of bonding pad metal patterns 262b located outside the chip bonding region 204, a plurality of second lead metal patterns 262c located within the chip bonding region 204, and a plurality of connecting segment metal patterns 262d extending between the second lead metal patterns 262c and the bonding pad metal patterns 262b. Optionally, the first metal plating layer 262 further comprises a first die pad pattern 262e located within the chip bonding region 204, and the second metal plating layer 264 further comprises a second die pad pattern 264e located within the chip bonding region 204, for forming the aforementioned die pad 290 in FIGS. 1A and 1B. Then, as shown in FIG. 2C, the first patterned mask 282 is removed.

Similarly, the method for forming the second metal plating layer 264 comprises, forming a second patterned mask 284 on the undersurface 202b of the conductive substrate 202. As shown in FIG. 2B, an electroplating process is performed to form the second metal plating layer 264 on a portion of the undersurface 202b exposed by the second patterned mask 284. Then, as shown in FIG. 2C, the second patterned mask 284 is removed.

Figure 2D:
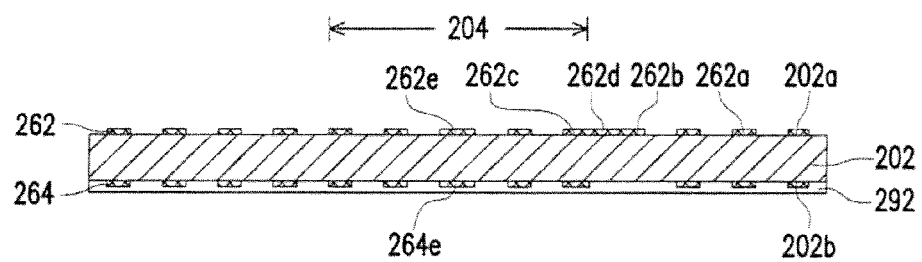
Figure 2E:
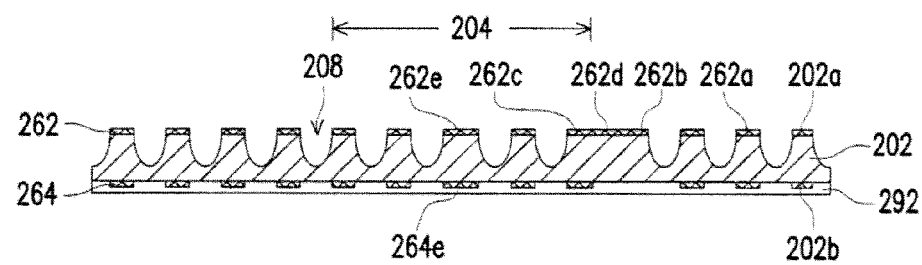
Figure 2F:
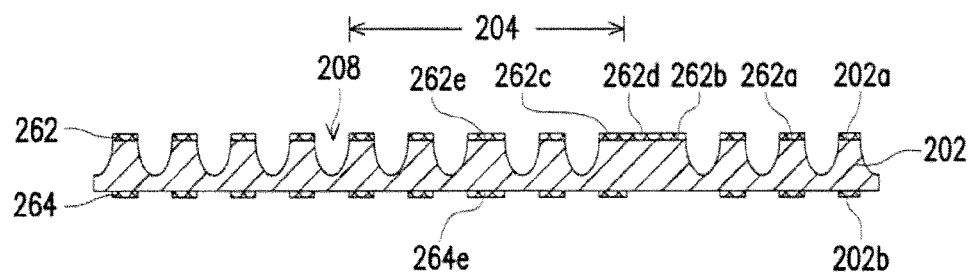

As shown in FIGS. 2D-2F, using the first metal plating layer 262 as a mask, a half etching process is performed on the conductive substrate 202 to form recesses 208 in regions of the conductive substrate 202 not covered by the first metal plating layer 262. When the half etching process is performed, as shown in FIG. 2E, a photoresist layer 292 is formed on the undersurface 202b of the conductive substrate 202 to cover and protect the second metal plating layer 264. After the half etching process is performed, as shown in FIG. 2F, the photoresist layer 292 is removed.

Figure 2G:
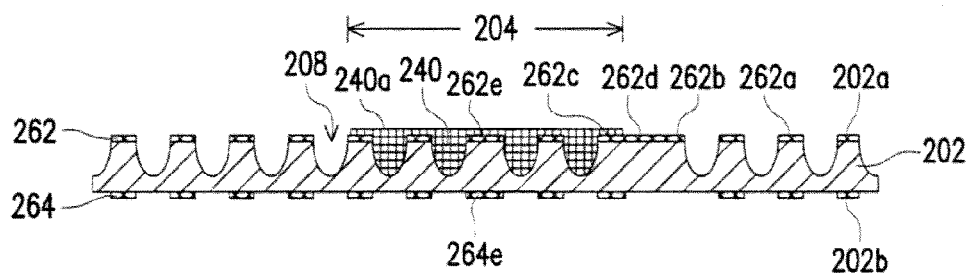

As shown in FIG. 2G, the filling material 240 is formed in the recesses 208 in the chip bonding region 204 so that a flat region 240a for placing the chip 210 thereon can be provided. Example embodiments of methods for applying the filling material 240 comprise (i) applying epoxy liquid onto the chip bonding region 204 by screen printing; or (ii) applying liquid photo-imageable solder mask ink on to the chip bonding region 204 by screen printing or spraying, exposing to the pattern and developing to remove the unnecessary portion; or (iii) attaching a dry film on the chip bonding region 204 by vacuum laminating, and then exposing and developing. All three of the foregoing processes may be subject to a thermal cure of some type after the pattern is defined. Other embodiments of methods for applying the filling material 240 are contemplated, and the foregoing examples should not be treated as limiting.

Figure 2J:
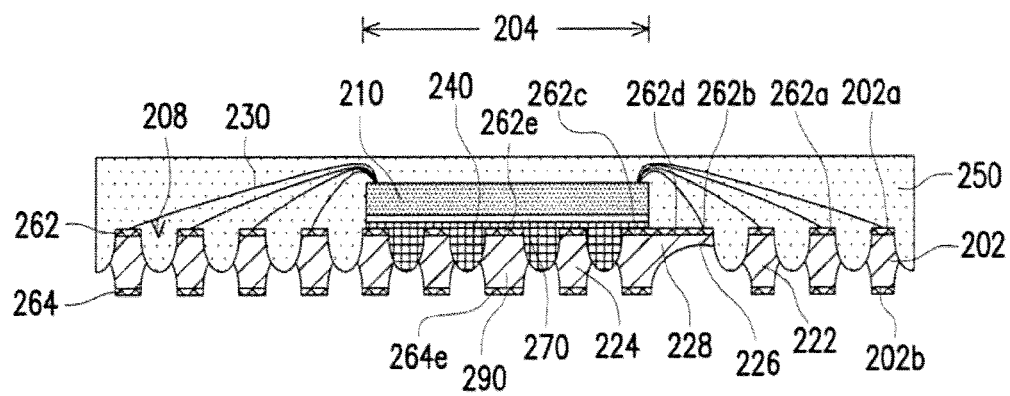
Figure 2G:
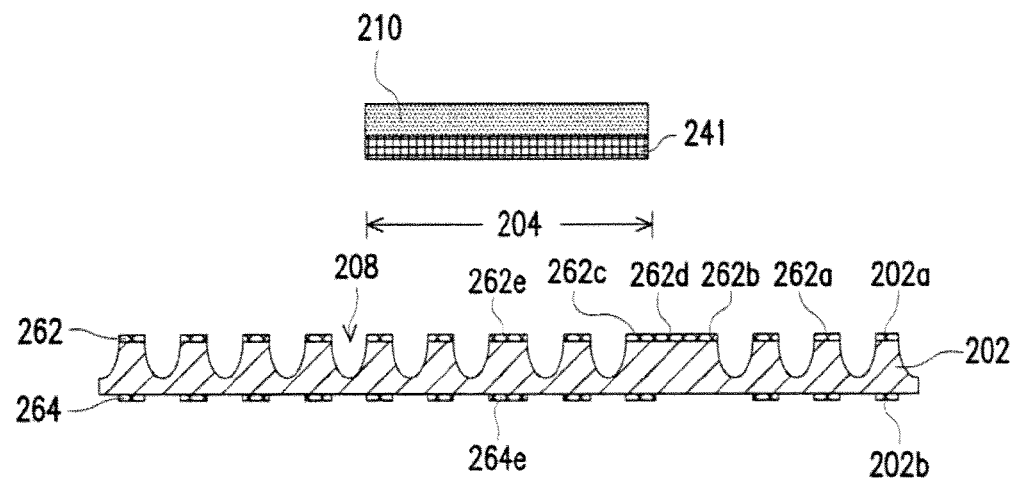
Figure 2H:
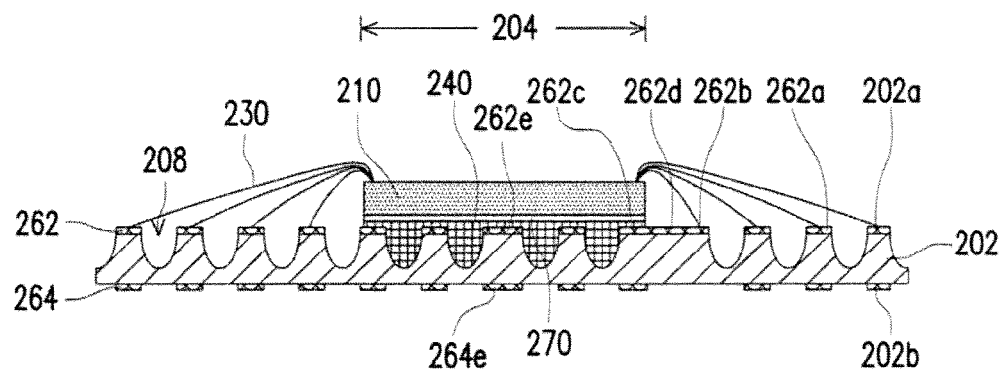

As shown in FIG. 2H, the chip 210 is bonded to the chip bonding region 204 of the conductive substrate 202 by an adhesion layer 270. The chip 210 is located on the filling material 240 and the second lead metal patterns 262c. A wire bonding process is then performed so that the chip 210 is connected to the bonding pad metal patterns 262b and to the first lead metal patterns 262a through a plurality of bonding wires 230. In alternative embodiments, when the filling material 240 is made of a material having adhesive properties, such as the epoxy resin, the filling material 240 itself can perform the functions of adhering and fixing the chip 210, allowing the adhesion layer 270 to be omitted.

Figure 2I:
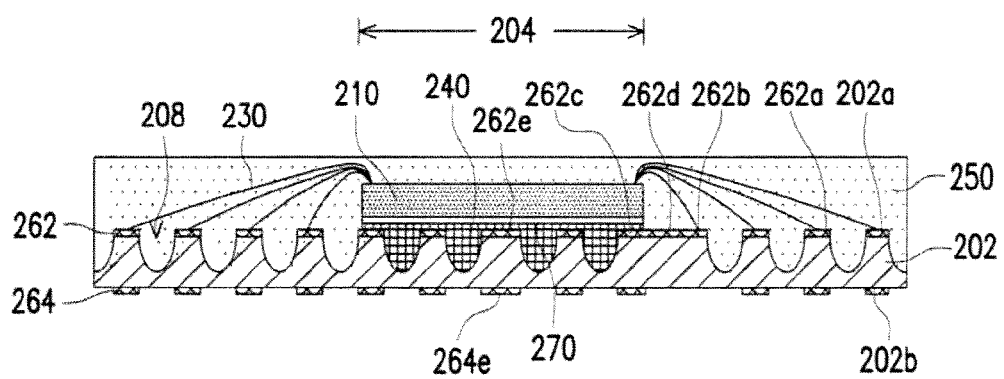

With reference to FIG. 2I, a molding compound 250 is formed on the top surface 202a of the conductive substrate 202 to enclose the chip 210 and the bonding wires 230, and the molding compound 250 fills up the remaining recesses 208. With reference to FIG. 2J, by using the second metal plating layer 264 as a mask, the undersurface of the conductive substrate 202 is etched to form a plurality of first leads 222 located outside the chip bonding region 204, a plurality of bonding pads 226 located outside the chip bonding region 204, a plurality of second leads 224 located at least partially within the chip bonding region 204, and a plurality of connecting segments 228 connecting the second leads 224 and the bonding pads 226. The die pad 290 can be formed by using the optionally formed first die pad pattern 262e and the optionally fowled second die pad pattern 264e as a mask. In the illustrated embodiment, and with reference to FIG. 1C, the filling material 240 encapsulates a part of each of the second leads 224 to provide a lead locking function by mechanically adhering to the second leads 224. In certain embodiments, the filling material 240 may extend around the peaks 224e of the second leads 224 to enhance the lead locking function, as described above with respect to the encapsulant 250 and the first leads 222.

Variations on the process illustrated in FIGS. 2A-2J are contemplated. For example, the die pad 290 may be omitted. Further, the second metal plating layer 264 shown in FIGS. 2B-2C may be formed on the undersurface 202b of the conductive substrate 202 after the molding compound 250 shown in FIG. 2I is formed.

FIG. 2G" illustrates an alternative variation on the process step shown in FIG. 2G. In this embodiment, a film material 241 having one or more adhesive layers may be used in place of the filling material 240. Example film materials 241 include, without limitation, Nippon Steel Chemical's NEX-130. In the illustrated embodiment, the film material 241 is first attached on an undersurface of a wafer (not shown). Subsequently, the wafer is diced into a plurality of the chips 210 with the film material 241 serving a similar function as the adhesive 211 and the filling material 240. Then, similar to FIG. 2H, the chip 210 with the film material 241 is bonded onto the chip bonding region 204. The film material 241 is preferably sufficiently compliant to fill the recesses 208 and perform the lead locking function described above. The film material 241 then may undergo a thermal cure process.

FIGS. 3A-3I are cross-sectional views illustrating a semiconductor packaging process according to another of the present embodiments. The embodiment of FIGS. 3A-3I is similar to the embodiment of FIGS. 2A-2J. However, in the embodiment of FIGS. 3A-3I omits the step of forming the filling material 240, and the molding compound 250, in a later process step, fills the recesses 208 including the recesses 208 under the chip 210.

Figure 3A:
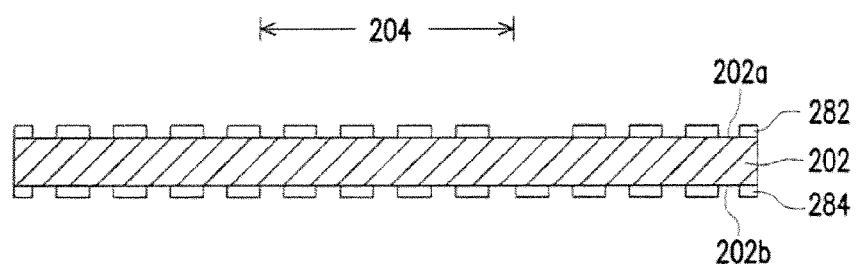
FIGS. 3A-3I are cross-sectional views of various steps in a semiconductor packaging process according to another of the present embodiments.
Figure 3B:
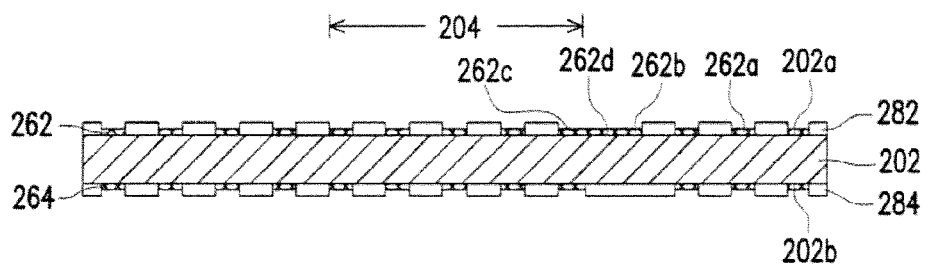
Figure 3C:
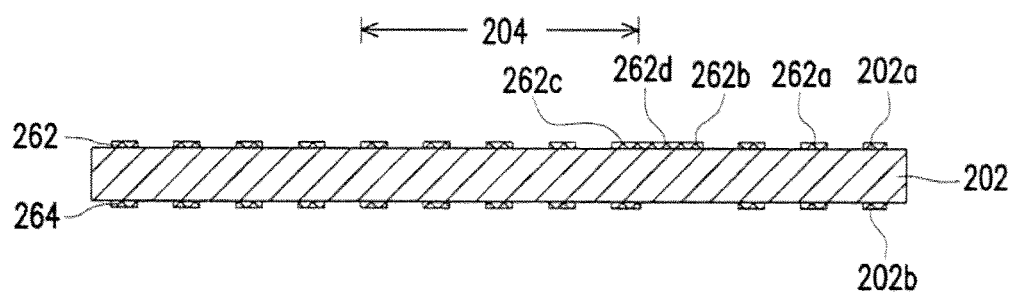

Referring to FIGS. 3A-3C, in one embodiment an electroplating process with the use of the first patterned mask 282 forms the patterned first metal plating layer 262 on the top surface 202a of the conductive substrate 202. The first metal plating layer 262 comprises a plurality of first lead metal patterns 262a located outside the chip bonding region 204, a plurality of bonding pad metal patterns 262b located outside the chip bonding region 204, a plurality of second lead metal patterns 262c located within the chip bonding region 204, and a plurality of connecting segment metal patterns 262d connecting the second lead metal patterns 262c and the bonding pad metal patterns 262b. With the use of the second patterned mask 284, the patterned second metal plating layer 264 is formed on the undersurface 202b of the conductive substrate 202 by, for example, an electroplating process.

Figure 3D:
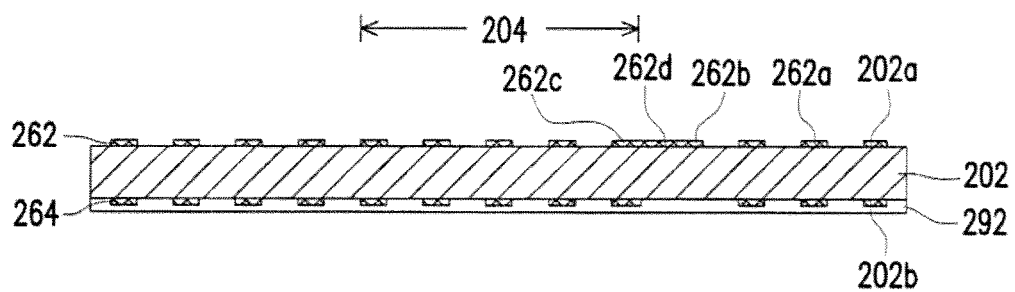
Figure 3E:
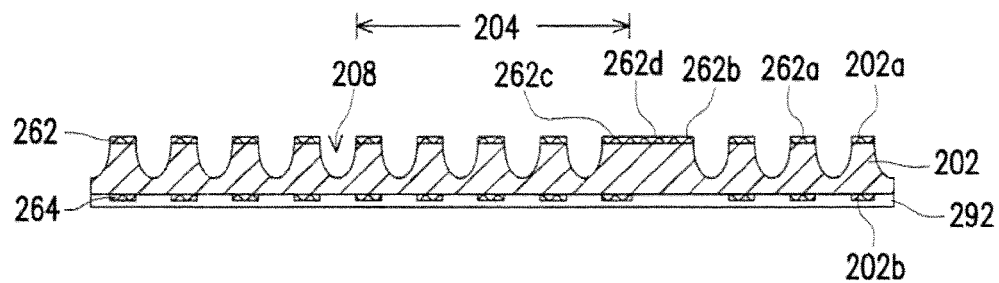
Figure 3F:
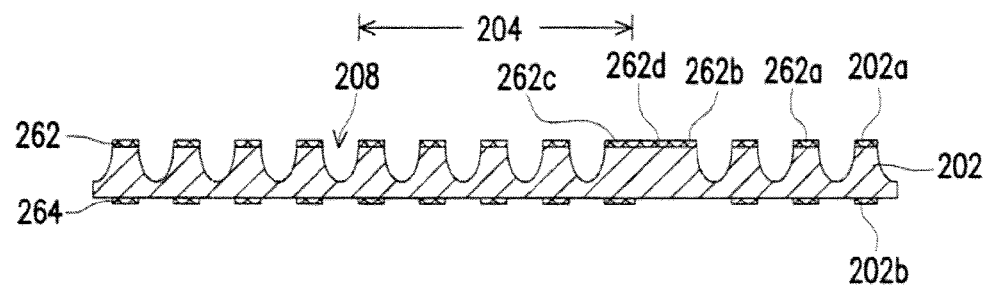
Figure 3G:
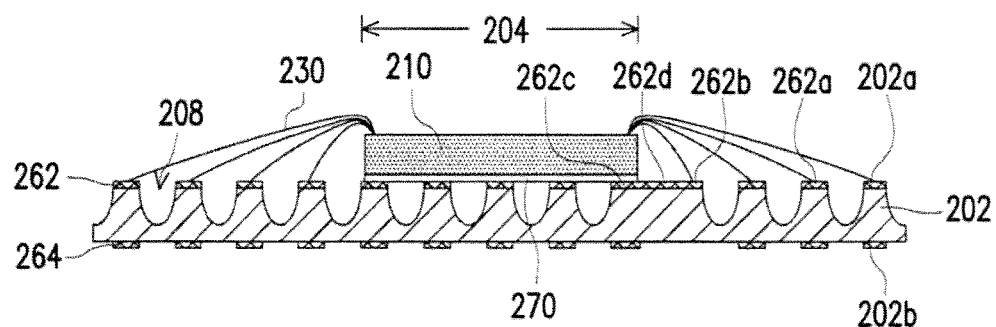

As shown in FIGS. 3D-3F, by using the first metal plating layer 262 as a mask, an etching process is performed on the conductive substrate 202 to form recesses 208 in the regions of the conductive substrate 202 not covered by the first metal plating layer 262. In FIG. 3G, the chip 210 is bonded to the chip bonding region 204 of the conductive substrate 202. In the present embodiment the adhesion layer 270 is disposed between the undersurface of the chip 210 and the second leads 224 (the filling material 240 and the die pad 290 are omitted in this embodiment). The method for forming the adhesion layer 270 may comprise attaching an adhesive transfer tape on the undersurface of the chip 210 and then bonding the chip 210 to the chip bonding region 204. The chip 210 is then electrically connected to the first leads 222 and the bonding pads 226 through bonding wires 230.

Figure 3H:
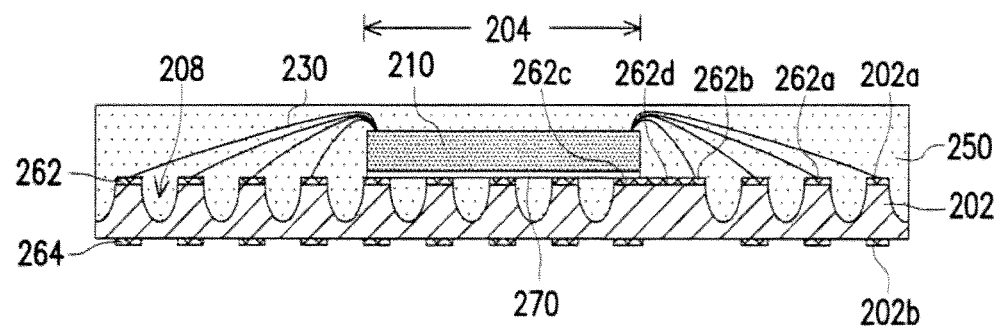
Figure 3I:
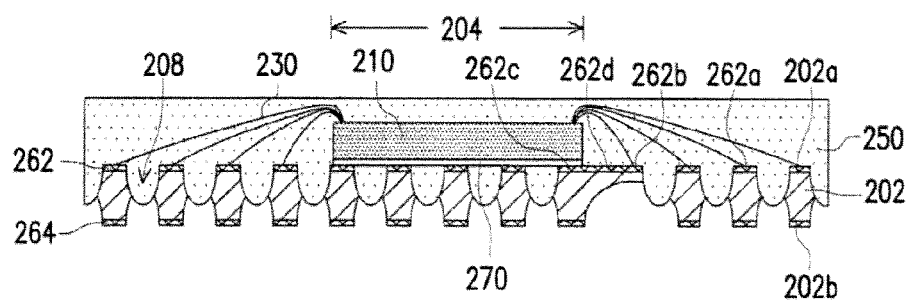

With reference to FIG. 3H, a molding compound 250 is formed on the top surface 202a of the conductive substrate 202 to enclose the chip 210 and the bonding wires 230. The molding compound 250 occupies at least a portion of the recesses 208, including the recesses 208 under the chip 210. With reference to FIG. 3I, by using the second metal plating layer 264 as a mask, the conductive substrate 202 is etched to form the first leads 222 located outside the chip bonding region 204, the bonding pads 226 located outside the chip bonding region 204, the second leads 224 located at least partially within the chip bonding region 204, and the connecting segments 228 connecting the second leads 224 and the bonding pads 226.

In an alternative embodiment (not shown), the second metal plating layer 264 may be formed on the undersurface 202b of the conductive substrate 202 after the molding compound 250 (FIG. 3H) is formed.

Figure 4A:
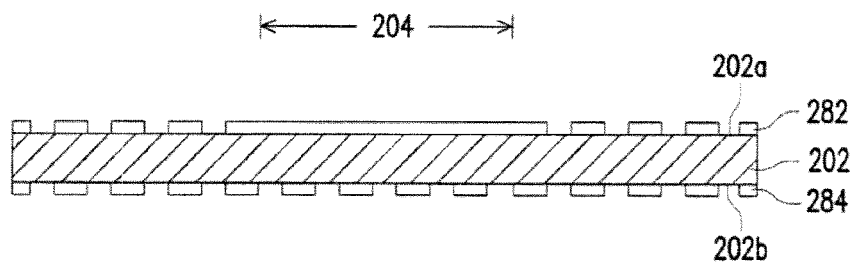
FIGS. 4A-4J are cross-sectional views of various steps in a semiconductor packaging process according to another of the present embodiments.
Figure 4B:
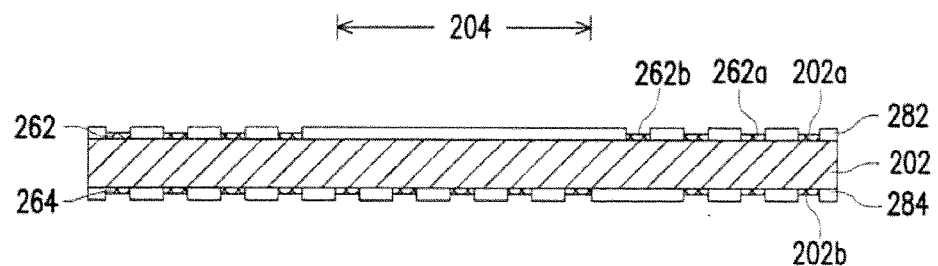
Figure 4C:
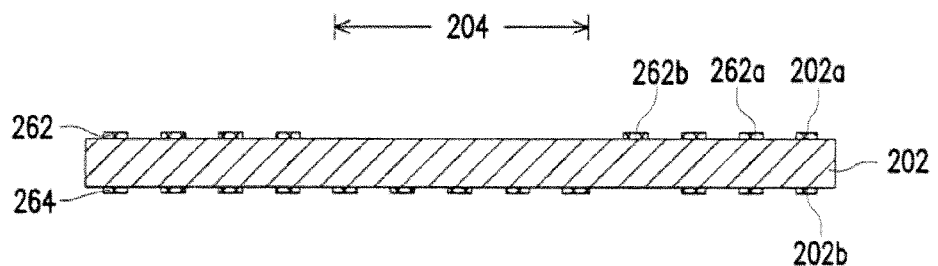
Figure 4D:
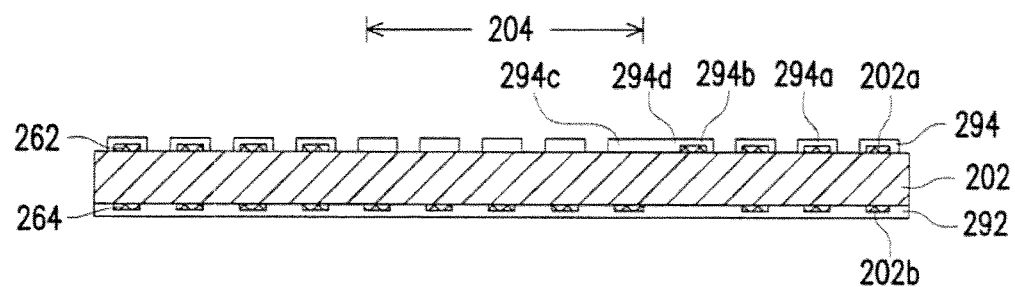

FIGS. 4A-4J are cross-sectional views illustrating a semiconductor packaging process according to another of the present embodiments. The embodiment of FIGS. 4A-4J is similar to the embodiment of FIGS. 2A-2J. However, in the embodiment of FIGS. 4A-4J the photoresist layer acts as the etching mask for forming the recesses 208. Further, the pattern of the first metal plating layer 262 formed in the embodiment of FIGS. 4A-4J is different from that formed in the embodiment of FIGS. 2A-2J. Since the photoresist layer is used as an etching mask, only the first lead metal patterns 262a and the bonding pad metal patterns 262b, which are used as the contacts, are formed in the embodiment of FIGS. 4A-4J. Further, the second lead metal patterns 262c and the connecting segment metal patterns 262d may be omitted. With reference to FIG. 4D, the top surface 202a and the undersurface 202b of the conductive substrate 202 can be covered by the same photoresist material 294 while the recesses 208 are formed. Therefore, the selection of the etching solution is relatively simple.

Referring to FIGS. 4A-4C, in one embodiment an electroplating process with the use of the first patterned mask 282 forms the patterned first metal plating layer 262 on the top surface 202a of the conductive substrate 202. The first metal plating layer 262 comprises a plurality of first lead metal patterns 262a outside the chip bonding region 204 and a plurality of bonding pad metal patterns 262b outside the chip bonding region 204. Moreover, with the use of the second patterned mask 284, the patterned second metal plating layer 264 is formed on the undersurface 202b of the conductive substrate 202 by, for example, an electroplating process.

In FIG. 4D, a patterned photoresist layer 294 is formed on the top surface 202a of the conductive substrate 202 and a photoresist layer 292 is formed on the undersurface 202b of the conductive substrate 202. The photoresist layer 294 comprises a plurality of first lead photoresist patterns 294a located outside the chip bonding region 204, a plurality of bonding pad photoresist patterns 294b located outside the chip bonding region 204, a plurality of second lead photoresist patterns 294c located at least partially within the chip bonding region 204, and a plurality of connecting segment photoresist patterns 294d connecting the second lead photoresist patterns 294c and the bonding pad photoresist patterns 294b.

Figure 4E:
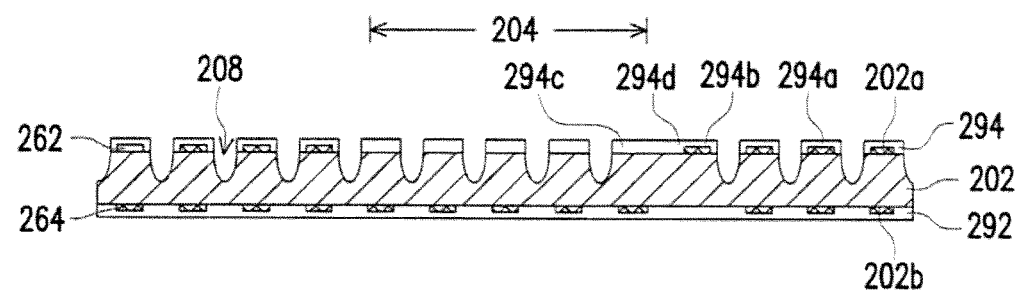
Figure 4F:
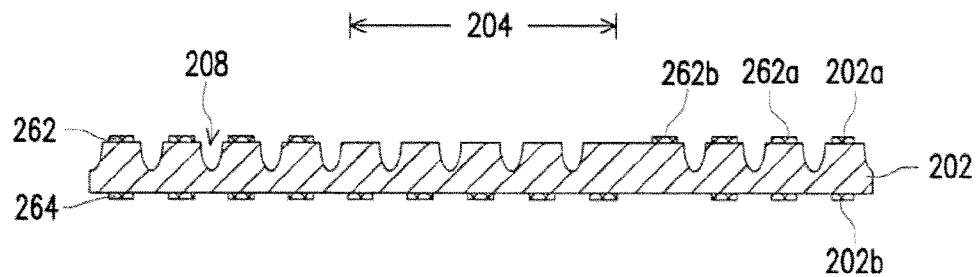
Figure 4G:
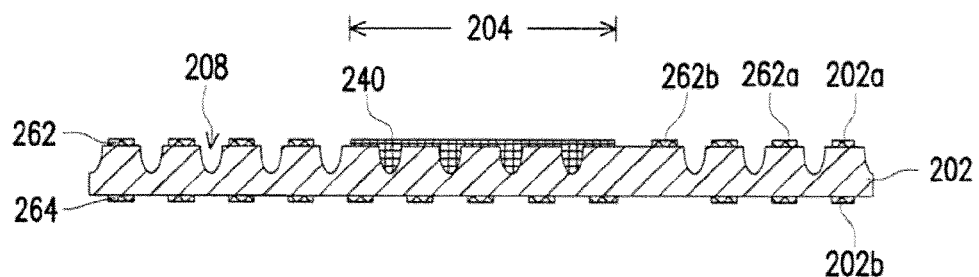

With reference to FIG. 4E, by using the photoresist layer 294 as a mask, a half etching process is performed on the upper surface 202a of the conductive substrate 202 to form the recesses 208 in the regions of the conductive substrate 202 not covered by the photoresist layer 294. Thereafter, as shown in FIG. 4F, the photoresist layers 292 and 294 are removed. With reference to FIG. 4G, the filling material 240 is formed in the recess 208 in the chip bonding region 204.

Figure 4H:
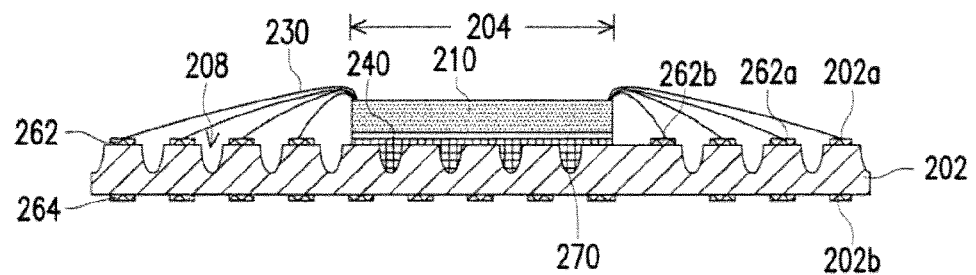
Figure 4I:
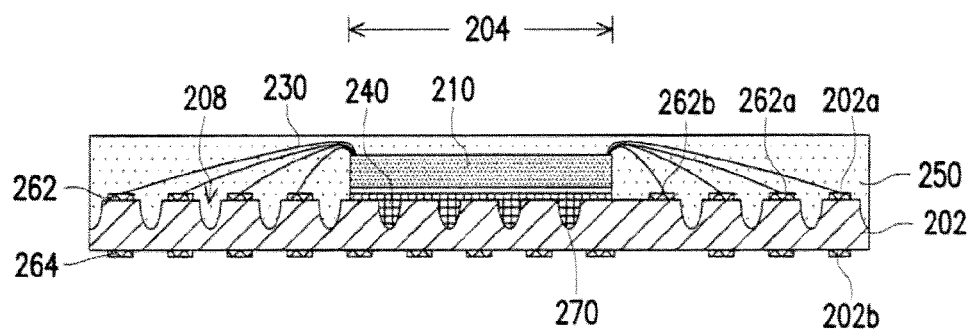

With reference to FIG. 4H, the chip 210 is bonded to the chip bonding region 204 of the conductive substrate 202. The chip 210 is located on the filling material 240. The chip 210 is then electrically connected to the bonding pad metal patterns 262b and the first lead metal patterns 262a through a plurality of bonding wires 230. With reference to FIG. 4I, the molding compound 250 is formed on the top surface 202a of the conductive substrate 202 to enclose the chip 210 and the bonding wires 230, and the molding compound 250 at least partially fills the recesses 208.

Figure 4J:
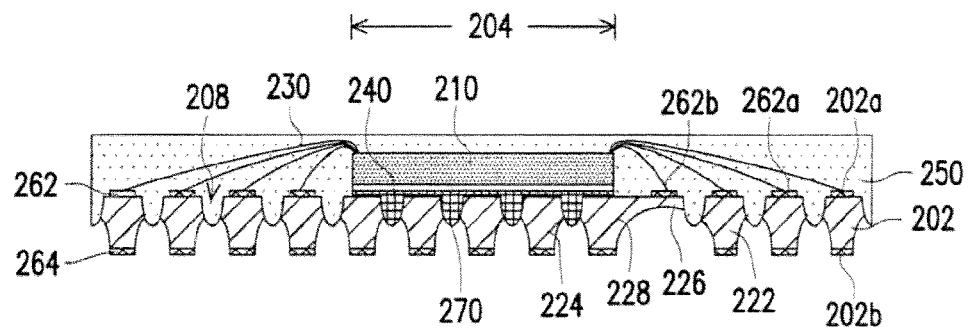

With reference to FIG. 4J, by using the second metal plating layer 264 as a mask, the undersurface 202b of the conductive substrate 202 is etched to form the first leads 222 located outside the chip bonding region 204, the bonding pads 226 located outside the chip bonding region 204, the second leads 224 located within the chip bonding region 204, and the connecting segments 228 connecting the second leads 224 and the bonding pads 226.

In an alternative embodiment (not shown), the second metal plating layer 264 may be formed on the undersurface 202b of the conductive substrate 202 after the molding compound 250 (FIG. 4) is formed.

FIGS. 5A-5I are cross-sectional views illustrating a semiconductor packaging process according to another of the present embodiments. The embodiment of FIGS. 5A-5I is similar to the embodiment of FIGS. 2A-2J. However, the embodiment of FIGS. 5A-5I omits the step of forming the filling material 240, and the molding compound 250, in a later process step, fills the recesses 208 including the recesses 208 under the chip 210.

Figure 5A:
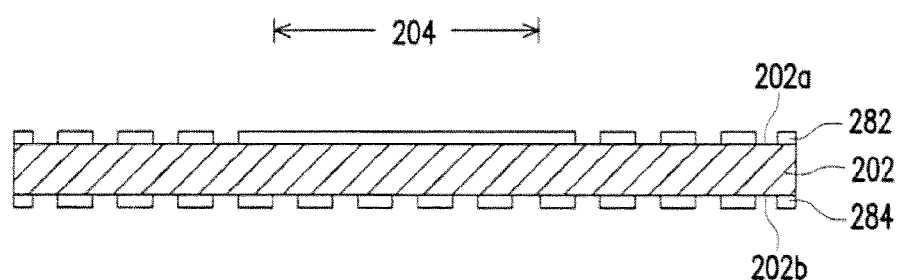
FIGS. 5A-5I are cross-sectional views of various steps in a semiconductor packaging process according to another of the present embodiments.
Figure 5B:
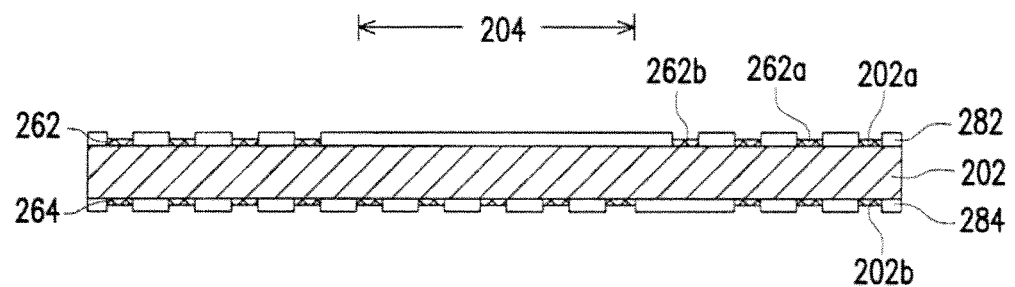
Figure 5C:
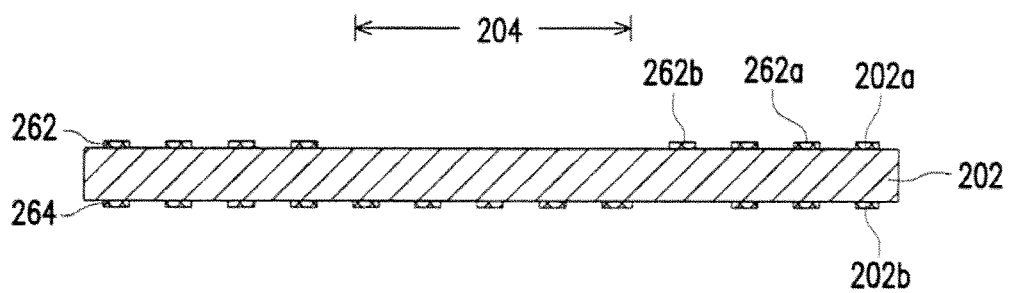

Referring to FIGS. 5A-5C, in one embodiment an electroplating process with the use of the first patterned mask 282 forms the patterned first metal plating layer 262 on the top surface 202a of the conductive substrate 202. The first metal plating layer 262 comprises a plurality of first lead metal patterns 262a outside the chip bonding region 204, and a plurality of bonding pad metal patterns 262b outside the chip bonding region 204. Moreover, with the use of the second patterned mask 284, the patterned second metal plating layer 264 is formed on the undersurface 202b of the conductive substrate 202 by, for example, an electroplating process.

Figure 5D:
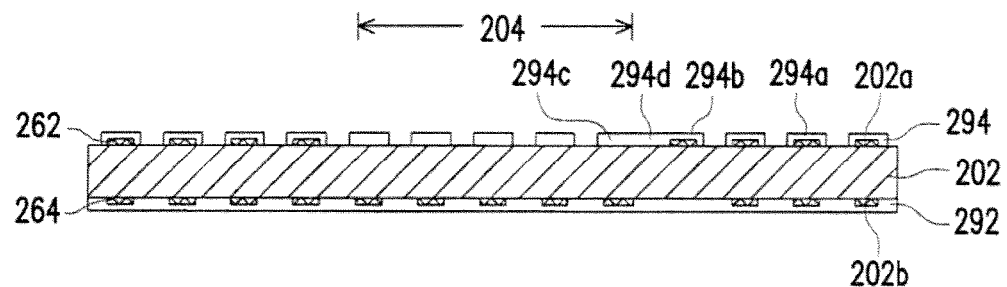

In FIG. 5D, a patterned photoresist layer 294 is formed on the top surface 202a of the conductive substrate 202 and a photoresist layer 292 is formed on the undersurface 202b of the conductive substrate 202. The photoresist layer 294 comprises a plurality of first lead photoresist patterns 294a located outside the chip bonding region 204, a plurality of bonding pad photoresist patterns 294b located outside the chip bonding region 204, a plurality of second lead photoresist patterns 294c located at least partially within the chip bonding region 204, and a plurality of connecting segment photoresist patterns 294d connecting the second lead photoresist patterns 294c and the bonding pad photoresist patterns 294b.

Figure 5E:
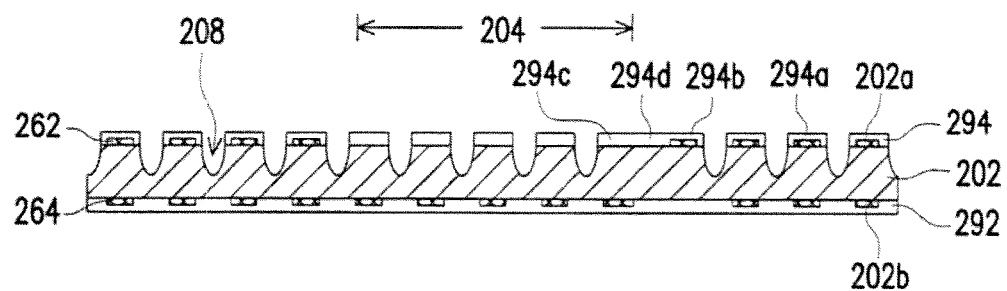
Figure 5F:
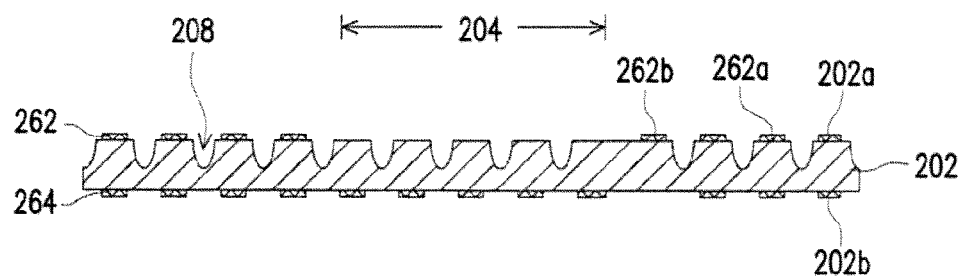
Figure 5G:
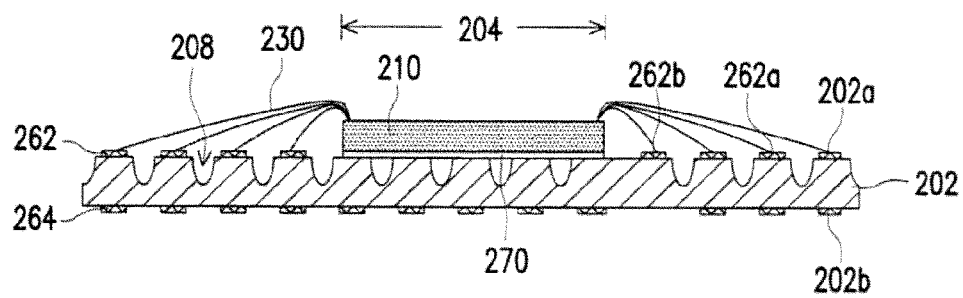

With reference to FIG. 5E, by using the photoresist layer 294 as a mask, a half etching process is performed on the upper surface 202a of the conductive substrate 202 to form the recesses 208 in a regions of the conductive substrate 202 not covered by the photoresist layer 294. Thereafter, as shown in FIG. 5F, the photoresist layers 292 and 294 are removed. With reference to FIG. 5G, the chip 210 is bonded to the chip bonding region 204 of the conductive substrate 202. The chip 210 is then electrically connected to the bonding pad metal patterns 262b and the first lead metal patterns 262a through a plurality of bonding wires 230. In the illustrated embodiment, the semiconductor package structure comprises the adhesion layer 270 located between the undersurface of the chip 210 and the second leads 224.

Figure 5H:
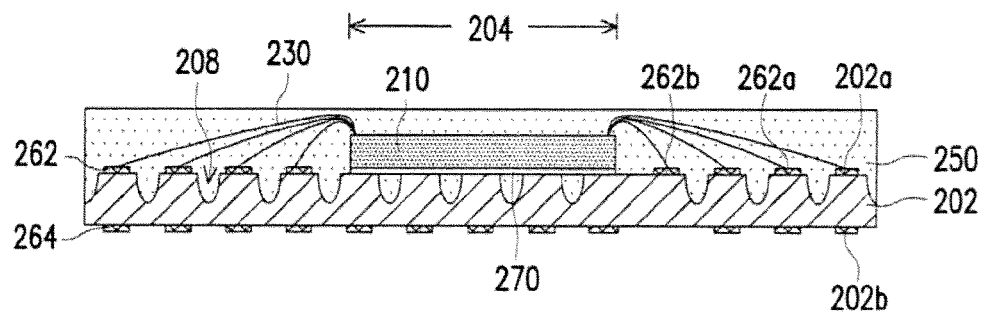
Figure 5I:
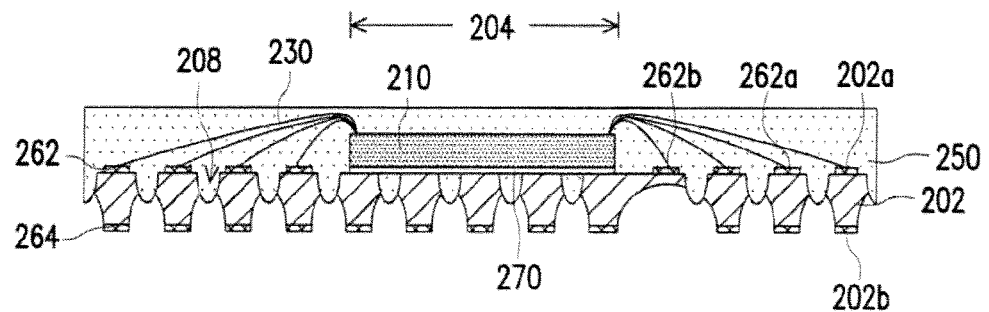

With reference to FIG. 5H a molding compound 250 is formed on the top surface 202a of the conductive substrate 202 to enclose the chip 210 and the bonding wires 230, and the molding compound 250 at least partially fills the recesses 208, including the recesses 208 under the chip 210. With reference to FIG. 5I, by using the second metal plating layer 264 as a mask, the conductive substrate 202 is etched to form the first leads 222 located outside the chip bonding region 204, the bonding pads 226 located outside the chip bonding region 204, the second leads 224 located within the chip bonding region 204, and the connecting segments 228 connecting the second leads 224 and the bonding pads 226.

In an alternative embodiment (not shown), the second metal plating layer 264 may be formed on the undersurface 202b of the conductive substrate 202 after the molding compound 250 (FIG. 5H) is formed.

As illustrated by the foregoing description, the present embodiments provide several advantages. For example, the present embodiments enable leads located at least partially beneath the chip to be used for I/O. The present embodiments thus provide a semiconductor package that is compact and has increased I/O density for greater performance in a smaller package. In certain embodiments an encapsulant and/or filling material surrounds peaks on the leads to increase the strength of the mechanical hold on the leads, decreasing the likelihood that the leads will separate from the package.

While the present invention has been described and illustrated with reference to specific embodiments thereof, these descriptions and illustrations do not limit the invention. It should be understood by those skilled in the art that various changes may be made and equivalents may be substituted without departing from the true spirit and scope of the invention as defined by the appended claims. The illustrations may not necessarily be drawn to scale. There may be distinctions between the artistic renditions in the present disclosure and the actual apparatus due to manufacturing processes and tolerances. There may be other embodiments of the present invention which are not specifically illustrated. The specification and the drawings are to be regarded as illustrative rather than restrictive. Modifications may be made to adapt a particular situation, material, composition of matter, method, or process to the objective, spirit and scope of the invention. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. A semiconductor package, comprising:
   a semiconductor chip;
   a plurality of first leads;
   a plurality of second leads, each of the second leads being disposed at least partially under the chip, each of the second leads having an upper sloped portion and a lower sloped portion meeting at a peak;
   a plurality of bonding pads extending outside a periphery of the chip;
   a plurality of connecting segments connecting each bonding pad to a respective one of the second leads; and
   a filling material occupying spaces between the chip and the upper sloped portions of the second leads;
   wherein the connecting segments include an angular offset routing between the second leads and the bonding pads.

2. The semiconductor package of claim 1, wherein upper surfaces of the first leads, the second leads, the bonding pads and the connecting segments are coplanar.

3. The semiconductor package of claim 1, wherein the first leads have an upper sloped portion and a lower sloped portion meeting at a peak.

4. The semiconductor package of claim 3, further comprising a package body that at least partially surrounds the peaks of the first leads to provide a mechanical hold on the first leads.

5. The semiconductor package of claim 4, wherein at east a portion of the lower sloped portions of the first leads protrudes from the package body.

6. The semiconductor package of claim 1, further comprising a first metal plating layer configured on the upper surface of each of the first leads, the upper surface of each of the second leads, the upper surface of each of the bonding pads, and the upper surface of each of the connecting segments, wherein the upper surface of each of the first leads and the first metal plating layer above the upper surface of each of the first leads are enclosed within a package body, and the upper surface of each of the second leads and the first metal plating layer above the upper surface of each of the second leads are enclosed within the filling material.

7. The semiconductor package of claim 1, further comprising a second metal plating layer configured on the lower surface of each of the first leads and the lower surface of each of the second leads, wherein the bonding pads and the connecting segments are not covered by the second metal plating layer.

8. The semiconductor package of claim 1, further comprising a package body, and wherein a material of the filling material and a material of the package body are the same.

9. The semiconductor package of claim 1, further comprising an adhesion layer between an undersurface of the chip and the filling material.

10. A semiconductor package, comprising:
    a semiconductor chip;
    a plurality of first leads;
    a plurality of second leads, each of the second leads being disposed at least partially under the chip;
    a plurality of bonding pads extending outside a periphery of the chip; and
    a plurality of connecting segments connecting each bonding pad to a respective one of the second leads;
    wherein upper surfaces of the first leads, the second leads, the bonding pads and the connecting segments are coplanar; and wherein the connecting segments include an angular offset routing between the second leads and the bonding pads.

11. The semiconductor package of claim 10, wherein an undersurface of the semiconductor chip is elevated above the upper surfaces of the first leads and the bonding pads.

12. The semiconductor package of claim 10, wherein the first leads have an upper sloped portion and a lower sloped portion meeting at a peak.

13. The semiconductor package of claim 12, further comprising a package body that at least partially surrounds the peaks of the first leads to provide a mechanical hold on the first leads.

14. The semiconductor package of claim 10, further comprising a plurality of connecting segments connecting each bonding pad to a respective one of the second leads, wherein upper surfaces of the connecting segments are coplanar with the upper surfaces of the first leads, the second leads, and the bonding pads.

15. The semiconductor package of claim 10, wherein upper surfaces of the second leads do not include a metal plating layer.

16. The semiconductor package of claim 1, further comprising a package body, and wherein a material of the filling material and a material of the package body are the different.

17. A semiconductor package, comprising:
a semiconductor chip;
a plurality of leads, a portion of the leads being disposed at least partially under the chip, each of the leads having an upper sloped portion and a lower sloped portion meeting at a peak;
a plurality of bonding pads extending outside a periphery of the chip;
a plurality of connecting segments connecting each bonding pad to a respective one of the leads; and
a filling material occupying spaces between the chip and the upper sloped portions of the portion of the leads that are disposed at least partially under the chip;
wherein the connecting segments include an angular offset routing between the leads and the bonding pads.

18. The semiconductor package of claim 17, further comprising a package body, and wherein a material of the filling material and a material of the package body are different.

19. The semiconductor package of claim 18, wherein at least a portion of the lower sloped portions of the leads protrudes from the package body.

20. The semiconductor package of claim 17, wherein upper surfaces of the leads, the bonding pads and the connecting segments are coplanar.

* * * * *